United States Patent
Mori et al.

(10) Patent No.: US 10,895,538 B2
(45) Date of Patent: Jan. 19, 2021

(54) METHOD OF PREPARING SAMPLE SURFACE, METHOD OF ANALYZING SAMPLE SURFACE, FIELD-ENHANCED OXIDATION PROBE, AND SCANNING PROBE MICROSCOPE INCLUDING FIELD-ENHANCED OXIDATION PROBE

(71) Applicant: SUMCO CORPORATION, Tokyo (JP)

(72) Inventors: Keiichiro Mori, Saga (JP); Kaori Hashimoto, Saga (JP); Chie Hide, Saga (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/312,455

(22) PCT Filed: Mar. 6, 2017

(86) PCT No.: PCT/JP2017/008641
§ 371 (c)(1),
(2) Date: Dec. 21, 2018

(87) PCT Pub. No.: WO2018/003183
PCT Pub. Date: Jan. 4, 2018

(65) Prior Publication Data
US 2019/0128824 A1 May 2, 2019

(30) Foreign Application Priority Data
Jun. 30, 2016 (JP) .................... 2016-130792

(51) Int. Cl.
*G01N 21/956* (2006.01)
*H01L 23/544* (2006.01)
(Continued)

(52) U.S. Cl.
CPC ............. *G01N 21/956* (2013.01); *G01N 1/28* (2013.01); *G01N 21/9501* (2013.01);
(Continued)

(58) Field of Classification Search
CPC ........ G01Q 70/06; G01Q 70/16; G01Q 80/00; G01Q 60/56; G01Q 70/10; B82Y 25/00; B82Y 35/00
(Continued)

(56) References Cited

U.S. PATENT DOCUMENTS 5,990,022 A * 11/1999 Motoura ................. H01L 22/34
257/E21.525
2003/0001243 A1  1/2003 Wu
(Continued)

FOREIGN PATENT DOCUMENTS

CN  1166693 A  12/1997
CN  1854793 A  11/2006
(Continued)

OTHER PUBLICATIONS

International Search Report issued in International Bureau of WIPO Patent Application No. PCT/JP2017/008641, dated May 30, 2017, together with an English translation.
(Continued)

*Primary Examiner* — David A Vanore
(74) *Attorney, Agent, or Firm* — Greenblum & Bernstein, P.L.C.

(57) ABSTRACT

Provided is a method of preparing a sample surface on which a marking is formed, wherein the marking is a local oxide film locally formed on the sample surface, the local oxide film is formed by applying voltage between a probe and the sample surface while a tip of the probe is in contact with the sample surface, and the probe is brought into contact with the sample surface after moisture supply.

15 Claims, 1 Drawing Sheet

(51) Int. Cl.
    *G01N 21/95* (2006.01)
    *G01N 1/28* (2006.01)
    *G01Q 80/00* (2010.01)
    *H01L 21/02* (2006.01)

(52) U.S. Cl.
    CPC ....... *G01Q 80/00* (2013.01); *H01L 21/02052* (2013.01); *H01L 23/544* (2013.01); *H01L 2223/54453* (2013.01)

(58) Field of Classification Search
    USPC .................................. 250/306; 850/48, 49
    See application file for complete search history.

(56) References Cited

U.S. PATENT DOCUMENTS

| | | | | |
|---|---|---|---|---|
| 2003/0183761 A1* | 10/2003 | Hantschel | .............. | G01Q 70/06 250/306 |
| 2004/0108864 A1 | 6/2004 | Yashiro et al. | | |
| 2004/0228962 A1* | 11/2004 | Liu | .......... | G01Q 70/06 427/58 |
| 2006/0065535 A1* | 3/2006 | Song | ........... | C25D 11/02 205/128 |
| 2010/0138964 A1* | 6/2010 | Amos | .................. | B82Y 35/00 850/49 |
| 2015/0364484 A1 | 12/2015 | Yasuda et al. | | |

FOREIGN PATENT DOCUMENTS

| | | |
|---|---|---|
| CN | 102403251 A | 4/2012 |
| JP | H07-45602 A | 2/1995 |
| JP | H10-246729 A | 9/1998 |
| JP | H10-260138 A | 9/1998 |
| JP | 3104640 B2 | 9/2000 |
| JP | 2001-221790 A | 8/2001 |
| JP | 2004-184323 A | 7/2004 |
| JP | 2016-001700 A | 1/2016 |
| KR | 10-2006-0103299 A | 9/2006 |

OTHER PUBLICATIONS

International Preliminary Report on Patentability issued in International Bureau of WIPO Patent Application No. PCT/JP2017/008641, dated Jan. 1, 2019, together with an English translation.
Japanese Office Action dated Jun. 4, 2019, issued in related Japanese Patent Application No. 2016-130792; and English-language translation thereof.
Supplementary Partial European Search Report for EP Application No. 17819553.3, dated Jan. 16, 2020.
Hiroyuki Sugimura et al; "Scanning Probe Anodization: Nanolithography Using Thin Films of Anodically Oxidizable Materials as Resists," Journal of Vacuum Science and Technology—Part A, vol. 13, No. 3, Part 1, pp. 1223-1227; May 1, 1996.
Extended European Search Report for EP App. No. 17819553.3 dated Apr. 7, 2020.
Office Action for CN App. No. 201780036199.5, dated Sep. 2, 2020 (w/ machine translation).

* cited by examiner

METHOD OF PREPARING SAMPLE SURFACE, METHOD OF ANALYZING SAMPLE SURFACE, FIELD-ENHANCED OXIDATION PROBE, AND SCANNING PROBE MICROSCOPE INCLUDING FIELD-ENHANCED OXIDATION PROBE

CROSS-REFERENCE TO RELATED APPLICATIONS

This application claims the benefit of priority to Japanese Patent Application No. 2016-130792 filed on Jun. 30, 2016, which is expressly incorporated herein by reference in its entirety.

TECHNICAL FIELD

The present invention relates to a method of preparing a sample surface on which a marking is formed, a method of analyzing a sample surface, a field-enhanced oxidation probe, and a scanning probe microscope including the field-enhanced oxidation probe.

BACKGROUND ART

In various fields, detailed information such as shapes, sizes and positions of abnormalities has been widely obtained by detailed analysis of the abnormalities such as foreign matters and defects on a sample surface using an analyzer such as a microscope. For example, in the field of semiconductor wafer manufacture, a cause of contamination on a sample surface (for example, surface of the semiconductor wafer) can be estimated by obtaining detailed information on such abnormalities, and on the basis of such estimation, management of the manufacturing step (for example, maintenance, replacement, and enhanced washing, and the like of the manufacturing device) for reducing the cause of the contamination can be performed. In addition, for example, JP Patent No. 3104640, which is expressly incorporated herein by reference in its entirety, has proposed that, before analyzing an abnormality in detail by an analyzer, a marking is formed in the vicinity of the abnormality on a sample surface to specify a position of the abnormality to be analyzed in detail.

SUMMARY OF INVENTION

JP Patent No. 3104640 discloses an anodization method as an example of a method of forming a marking (see claim 7 of JP Patent No. 3104640, and the like). By a local oxidation method such as the anodization method, a local oxide film can be formed as a marking on a sample surface. As an example, when an electron microscope is used as an analyzer, such a local oxide film is observed as a bright (for example, white) part in a microscopic image by taking charge at the time of microscopy. Thereby, an abnormality in the vicinity of the spot can be identified to be an abnormality to be analyzed in detail.

As a method of identifying a position of an abnormality on a sample surface, a method using coordinate data output by an LPD (light point defect) inspection device is also known, for example, in the field of semiconductor wafer manufacture. However, this method is difficult to apply unless the analyzer for detailed analysis of the abnormality is a device having a mechanism capable of setting the position to be analyzed on the basis of the coordinate data output by the LPD inspection device. That is, applicable analytical devices are limited. In contrast, the method of forming a marking on the sample surface by the local oxidation method can be applied as a pretreatment for detailed analysis by the analyzer regardless of the presence or absence of such a mechanism, as described above.

As described above, the method of forming a marking on the sample surface by the local oxidation method (i.e. the method of preparing the sample surface on which the marking is formed) is a useful method having an advantage that it can be applied as a pretreatment for detailed analysis of abnormalities by various analyzers. The present inventors have repeatedly studied to further enhance the usefulness of such a method.

In the method of forming the marking on the sample surface by the local oxidation method, specifically, a local oxide film (marking) can be formed by causing field-enhanced oxidation through voltage application between a probe and the sample surface while a probe tip is in contact with the sample surface. As a result of diligent studies, the present inventors have newly found that, in an embodiment, the number of available markings continuously formed by one probe can be increased by supplying moisture to the probe before contact with the surface of the sample compared to a case where moisture is not supplied to the probe. In addition, it has been newly found that, in an embodiment, a thicker local oxide film can be formed by supplying moisture to the probe before contact with the sample surface, compared to the case where moisture is not supplied to the probe.

As the number of available markings continuously formed by one probe increases, more markings can be continuously formed on the same sample surface by one probe, or markings can be formed on the surfaces of more samples. In addition, since the thicker local oxide film can be more clearly observed, it can contribute to easiness in position identification of the abnormality by marking and/or improvement of accuracy for position identification. In such a way, the usefulness of the method of forming the marking on the sample surface by the local oxidation method can be further enhanced.

An aspect of the present invention has been completed on the basis of the above findings.

That is, an aspect of the present invention relates to a method of preparing a sample surface on which a marking is formed (hereinafter, also referred to as "method of preparing the sample surface" or "preparation method"), wherein the marking is a local oxide film locally formed on the sample surface, the local oxide film is formed by applying voltage between a probe and the sample surface while a probe tip is in contact with the sample surface, and the probe is brought into contact with the sample surface after moisture supply.

In the present invention and the specification, the "moisture supply" performed on the probe means a treatment that moisture is supplied to at least the probe tip.

An embodiment of the moisture supply is a treatment that the probe tip to be supplied with moisture is brought into contact with a hydrophilic surface.

In the present invention and the specification, the "hydrophilic surface" means a surface having a contact angle with respect to water of 0° to 40° (preferably 0° to 30°). In addition, the "hydrophobic surface" described later means a surface having a contact angle of higher than 40° and equal to or lower than 65° with respect to water (preferably 50° to 60°), and the "super-hydrophobic surface" means a surface having a contact angle of higher than 65° and equal to or lower than 90° with respect to water (preferably 70° to 80°). Furthermore, in the present invention and the specification, the contact angle with respect to water means a contact angle with respect to water measured by a drop method under a measurement environment at a temperature of 20° C. to 27° C. and a relative humidity of 30% to 70%.

In an embodiment, the hydrophilic surface to be brought into contact with the probe tip to be supplied with moisture is a surface after cleaning.

In an embodiment, the hydrophilic surface to be brought into contact with the probe tip to be supplied with moisture is a silicon wafer surface after cleaning.

In an embodiment, the silicon wafer surface after cleaning is a silicon wafer surface after SC-1 cleaning. Herein, "SC-1 cleaning (Standard Cleaning-1)" means cleaning with an SC1 liquid, a mixture of ammonia water, $H_2O_2$ and $H_2O$.

An embodiment of moisture supply is a treatment that the probe to be supplied with moisture is held under a wet atmosphere. In the present invention and the specification, the "wet atmosphere" means an atmosphere at a relative humidity of 70% to 100%.

In an embodiment, the sample surface to be brought into contacted with the probe supplied with moisture is a super-hydrophobic surface or a hydrophobic surface.

In an embodiment, the sample surface to be brought into contacted with the probe supplied with moisture is a silicon wafer surface.

In an embodiment, the sample surface to be brought into contacted with the probe supplied with moisture is an epitaxial layer surface of a silicon epitaxial wafer.

In an embodiment, the probe supplied with moisture is brought into contact with the sample surface in a state where the probe supplied with moisture is attached to a scanning probe microscope.

In an embodiment, the surface of the probe tip to be supplied with moisture is a metal surface.

A further aspect of the present invention relates to a method of analyzing a sample surface (hereinafter, also referred to as "analysis method"), including forming, on the sample surface, a marking which indicates a position of an abnormality present on the surface, and identifying the position of the abnormality to be analyzed by the marking to analyze the identified abnormality by an analyzer, wherein the sample surface on which the marking is formed is prepared by the method of preparing the sample surface according to an aspect of the present invention.

A further aspect of the present invention relates to a field-enhanced oxidation probe, wherein at least its tip surface is a metal oxide surface.

In an embodiment, the metal oxide surface is an oxide surface of an alloy composed of Cr and Au.

A further aspect of the present invention relates to a scanning probe microscope including the field-enhanced oxidation probe.

According to an aspect of the present invention, usefulness of the method of forming the marking on the sample surface (i.e. the method of preparing the sample surface on which the marking is formed) by a local oxidation method can be improved.

DESCRIPTION OF EMBODIMENTS

[Method of Preparing Sample Surface]

Figure 1:
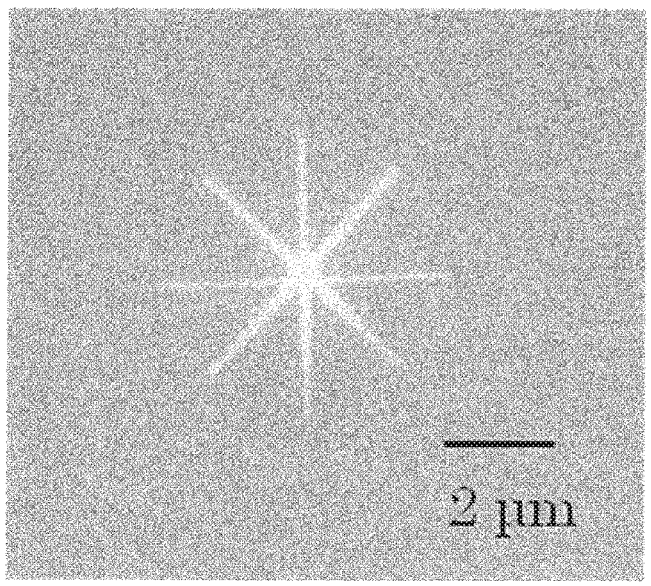
FIG. 1 shows an SEM image of a marking (local oxide film) formed in Example 1.

An aspect of the present invention relates to a method of preparing a sample surface on which a marking is formed, wherein the marking is a local oxide film locally formed on the sample surface, the local oxide film is formed by applying a voltage between a probe and the sample surface while a probe tip is in contact with the sample surface, and the probe is brought into contact with the sample surface after moisture supply.

Hereinafter, the above preparation method will be explained in more detail.

<Sample Surface>

The sample surface on which the marking is to be formed in the above preparation method can be a sample surface on which an abnormality present on this sample surface is analyzed by an analyzer after the marking is formed. An aspect of such a sample surface can be exemplified by a semiconductor sample surface. The semiconductor sample can be exemplified by a wafer-shaped semiconductor sample i.e. a semiconductor wafer. However, the semiconductor sample is not limited to the wafer shape. For example, the semiconductor sample may be a sample obtained by cutting out a part of the semiconductor wafer, or a sample obtained by cleaving an ingot.

The semiconductor wafer can be exemplified by various semiconductor wafers such as a silicon wafer. In the present invention and the specification, the silicon wafer includes a silicon single crystal wafer (bare wafer; which may be p-type or n-type) and a wafer having one or more layers on a bare wafer. Specific examples of the one or more layers may include an epitaxial layer, an oxide film, and the like. In an embodiment, the sample surface on which the marking is to be formed can be an epitaxial layer surface of a silicon epitaxial wafer.

For example, the epitaxial layer surface is normally a super-hydrophobic surface or a hydrophobic surface in a state where cleaning is not carried out after the epitaxial layer forming step (epitaxial growth step). In addition, not only the epitaxial layer surface but also the silicon wafer surface is normally a super-hydrophobic surface or a hydrophobic surface, for example, after hydrofluoric acid (HF) cleaning. Furthermore, in the sample subjected to the electron microscopy, the moisture content decreases because the sample is placed in a vacuum chamber in the electron microscope, and thus its surface tends to become a super-hydrophobic surface or a hydrophobic surface. From the study by the present inventors, such a super-hydrophobic surface or hydrophobic surface has tended to be difficult to form clearly-observable markings by the local oxidation method. In contrast, the method of preparing the sample surface according to an aspect of the present invention can allow formation of the clearly-observable marking on the super-hydrophobic surface or hydrophobic surface. The present inventors consider that this is because moisture is supplied to the probe before contact with the sample surface. However, the method of preparing the sample surface according to an aspect of the present invention is not limited to an embodiment in which the sample surface is a super-hydrophobic surface or hydrophobic surface. In an embodiment, the sample surface can be a hydrophilic surface. The sample surface may be any surface on which a local oxide film can be formed by applying a voltage between the probe and the sample surface while it is in contact with the probe tip, and is not limited to the semiconductor sample surface exemplified above.

<Probe>

The probe used for forming a local oxide film on the sample surface to be supplied with moisture may be any probe on which a voltage can be applied between the probe and the sample surface after moisture supply. From this point, as a probe to be supplied with moisture, a probe in which at least the tip surface to be brought into contact with the sample surface is a metal surface, is preferred. The "metal" in the present invention and the specification includes pure metals and alloys. The alloy includes an alloy composed of a plurality of metal elements and an alloy composed of at least one metallic element and at least one nonmetallic element. The alloy is preferably an alloy composed of a plurality of metallic elements. The metal surface is preferably a surface of an alloy composed of, for example, Cr, Au, Rd, Pt, or two or more of these metallic elements. The probe may be a probe entirely made of metals, a probe made of materials other than metal and having a metal coated layer on at least the probe tip in contact with the sample surface, or a probe made of materials other than metal and having a metal coated layer on its entire surface. Also, the probe may be a probe made of metals and having a metal coated layer on the probe tip or the entire surface. Specific examples of the probe to be supplied with moisture include a probe made of SiN and having a metal coated layer on its entire surface, such as a probe made of Si and having a metal coated layer on its entire surface. More specifically, examples thereof include a probe made of SiN and having a coated layer of an alloy composed of Cr and Au (hereinafter, also referred to as "Cr/Au") on its entire surface, a probe made of Si and having an Rd coated layer on its entire surface, and the like can be exemplified. From the viewpoint of improving operability, the probe is preferably attached to a tip of a cantilever for use. Since a probe is normally attached to the tip of the cantilever in a scanning probe microscope (SPM), a probe installed on a scanning probe microscope is preferably used as a probe to be brought into contact with the sample surface. The size and shape of the probe are not particularly limited.

<Moisture Supply>

The probe described above is supplied with moisture before contact with the sample surface. The present inventors consider that the contact of the probe with the sample surface after the moisture supply contributes to increase of the number of available markings continuously formed by one probe and/or formability of a thicker local oxide film. In addition, the present inventors predict that the above contact contributes formability of the clearly-observable marking also on the sample surface which is normally difficult to form the clearly-observable marking by a local oxidation method, such as the super-hydrophobic surface or hydrophobic surface.

An embodiment of the moisture supply is a treatment of bringing the probe tip into contact with the hydrophilic surface. Furthermore, another embodiment of the moisture supply is a treatment of holding the probe under a wet atmosphere. Hereinafter, the above embodiments will be sequentially explained.

(Contact with Hydrophilic Surface)

In an embodiment of the moisture supply, the probe tip before contact with the sample surface is brought into contact with the hydrophilic surface. The definition of the hydrophilic surface is as described above. For example, the surface after cleaning tends to become a hydrophilic surface. Thus, in an embodiment, the hydrophilic surface can be the surface after cleaning. Specific examples of the cleaned surface can include a silicon wafer surface. From the viewpoint of further improving the hydrophilicity of the silicon wafer surface, SC-1 cleaning, ozone water cleaning, sulfuric acid-hydrogen peroxide solution cleaning (for example, piranha cleaning, SPM (sulfuric acid hydrogen peroxide mixture) cleaning, and the like), and the like are preferred for cleaning, and SC-1 cleaning is more preferred. With regard to the cleaning, various conditions such as a cleaning period and a temperature of the cleaning liquid can be similar to the conditions applied to the normal cleaning for a silicon wafer. The cleaned surface may be brought into contact with the probe tip after drying, or may be brought into contact with the probe tip without drying. Since the hydrophilic surface easily adsorbs and retains moisture in the atmosphere, it is considered that moisture can be supplied to the probe tip by bringing it into contact with the surface adsorbing and retaining moisture (hydrophilic surface). The temperature and the humidity of the atmosphere for bringing the hydrophilic surface into contact with the probe tip may be, for example, 20° C. to 27° C. and 30% to 70%. In addition, the probe tip can be made to move (scan) on the hydrophilic surface while it is in contact with the hydrophilic surface, and it is preferable to make it to move.

In an embodiment, a voltage can be applied between the hydrophilic surface and the probe while the hydrophilic surface is in contact with the probe tip. The voltage can be applied, for example, in such a way that a negative voltage is applied to the probe side, and the probe side is supposed to be a negatively-charged side and the hydrophilic surface side is supposed to be a positively-charged side. Alternatively, the voltage can be applied, for example, in such a way that a positive voltage is applied to the probe side, and the probe side is supposed to be a positively-charged side, and the hydrophilic surface side is supposed to be a negatively-charged side. The applied voltage can be, for example, 1V to 10 V.

Regarding the moisture supply, the present inventors consider that an oxide film may be formed on the probe tip by water adhesion due to the moisture supply. Although the following is a mere guess by the present inventors, they guess that the hydrophilicity of the probe tip is increased by formation of the oxide film, and the probe tip having increased hydrophilicity easily tends to adsorb and to retain moisture in the atmosphere. It is considered that formation of the oxide film can be promoted through field-enhanced oxidation by applying a voltage while the hydrophilic surface is in contact with the probe tip.

(Retention Under Wet Atmosphere)

In another embodiment of the moisture supply, the probe before contact with the sample surface is held under a wet atmosphere. The wet atmosphere refers to the atmosphere at the relative humidity described above. The retention period under the wet atmosphere can be, for example, 1 hour to 48 hours, preferably 24 hours to 48 hours. The temperature of the wet atmosphere can be, for example, 20° C. to 40° C., but is not particularly limited.

<Formation of Marking (Local Oxide Film)>

After the moisture supply explained above, a voltage is applied between the probe and the sample surface while the probe tip is in contact with the sample surface. Thereby, the local oxide film (marking) can be formed on the sample surface by field-enhanced oxidation. When the case that the sample surface is a silicon wafer surface is taken as an example, it is considered that an oxidation reaction is advanced on the sample surface as described below, so that an oxide film is locally formed on a part in contact with the probe tip. However, the following reaction is an example, and a local oxide film can be formed also on a surface of a sample other than the silicon wafer by field-enhanced oxidation.

$$2H_2O \rightarrow 2H^+ + 2OH^-$$

$$2H^+ + 2e^- \rightarrow H_2 \text{(Cathode)}$$

$$Si + 2OH^- \rightarrow SiO_2 + H_2 + 2e^- \text{(Anode)}$$

$$Si + 2H_2O \rightarrow SiO_2 + 2H_2$$

The shape of the marking formed on the sample surface is not particularly limited. For example, a marking having a desired shape can be formed by making the probe tip move (scan) on the sample surface while applying a voltage. The thickness of the formed local oxide film is preferably more than 2 nm, more preferably equal to or more than 3 nm, even more preferably equal to or more than 4 nm, and still more preferably equal to or more than 5 nm from the viewpoint of forming the local oxide film as a clearly-observable marking. In addition, the thickness of the local oxide film can be, for example, equal to or less than 10 nm, or equal to or less than 8 nm. However, the thickness of the local oxide film may exceed the values exemplified above, because a thick local oxide film is preferred from the viewpoint of forming a local oxide film as a clearly-observable marking.

In an embodiment, a voltage can be applied in such a way that a negative voltage is applied to the probe side, and the probe side is supposed to be a negatively-charged side and the sample surface side is supposed to be a positively-charged side. Field-enhanced oxidation caused by applying a voltage in the above way is generally called anodization. Alternatively, a voltage can be applied in such a way that a positive voltage is applied to the probe side, and the probe side is supposed to be a positively-charged side and the sample surface side is supposed to be a negatively-charged side. The applied voltage can be, for example, 1V to 10 V. With regard to the temperature and the humidity of the atmosphere for bringing the sample surface into contact with the probe tip, for example, the temperature can be 20° C. to 27° C. and the relative humidity can be 30% to 70%. Furthermore, the contacting period is not particularly limited, and can be set depending on the shape, size, thickness, and the like, of the marking to be formed.

In accordance with the method of preparing the sample surface according to an aspect of the present invention explained above, various local oxide films having different shapes, sizes, thicknesses, and the like can be formed as markings on the surfaces of various samples by the local oxidation method. Such a marking is preferably formed in the vicinity of the abnormality to identify the position of the abnormality to be analyzed in detail and present on the sample surface. Details on the method of analyzing the sample surface using the method of preparing the sample surface according to an aspect of the present invention will be described later.

[Method of Analyzing Sample Surface]

An aspect of the present invention relates to a method of analyzing a sample surface, including forming, on the sample surface, a marking which indicates a position of an abnormality present on the surface, and identifying the position of the abnormality to be analyzed by the marking to analyze the identified abnormality by an analyzer, wherein the sample surface on which the marking is formed is prepared by the method of preparing the sample surface according to an aspect of the present invention.

<Sample Surface>

The sample surface having an abnormality to be analyzed is as described above for the method of preparing the sample surface according to an aspect of the present invention.

<Formation of Marking>

As a pretreatment for detailed analysis of abnormalities such as foreign matters and defects on the sample surface, a local oxide film can be formed as a marking on the sample surface by the method of preparing the sample surface according to an aspect of the present invention. This marking is formed to indicate one of the abnormalities to be analyzed in detail. Thus, the marking is preferably formed in the vicinity of the abnormality to be analyzed. With regard to the term "vicinity", the distance between the abnormality and the marking is not particularly limited, and it may be determined depending on the size of the sample surface, the size of the abnormality, the resolution of the analyzer, and the like. Details on the marking formation are as described above for the method of preparing the sample surface according to an aspect of the present invention. At least one marking is formed on the sample surface, and two or more markings may be formed to identify the position of one abnormality. Alternatively, one or more markings may be respectively formed on each of two or more abnormalities to identify the positions of two or more abnormalities present on the same sample surface. Alternatively, the shapes, sizes, numbers, and the like of the markings for identifying different abnormalities may be changed to distinguish the abnormalities.

<Analysis of Abnormality>

After forming the marking, the sample surface on which the marking is formed is analyzed by an analyzer. As the analyzer, various electron microscopes such as SEM (Scanning Electron Microscope) and TEM (Transmission Electron Microscope) are preferred. At the time of observation by the electron microscope, a contrasting density can be provided on the microscope image by a charged local oxide film (marking), and thereby the presence of the marking can be confirmed to identify the position of the abnormality. Furthermore, at the identified position, the composition analysis or the like can be carried out by an AES (Auger Electron Spectroscopy) apparatus, EDX (Energy Dispersive X-ray spectroscopy) apparatus, and the like, to analyze the constituent elements and the like of the abnormality.

When the case that the sample surface having the abnormality to be analyzed is a semiconductor wafer such as a silicon wafer is taken as an example, a method of identifying a position of an abnormality on the basis of coordinate data output by an LPD inspection device as described above, is also known. When using this method, an LPD is observed by moving a stage to a coordinate having the LPD (i.e. abnormality) to be analyzed, on the basis of the coordinate data output from the LPD inspection device, using a wafer-compliant Review-SEM, an AFM (Atomic Force Microscope), or the like. The term "wafer-compliant" means that a mechanism capable of identifying the position coordinate on the wafer surface is installed. When observing the LPD with the wafer-compliant Review-SEM or the AFM, there is normally a difference between the coordinate output by the LPD inspection device and the coordinates actually having the LPD, and thus the LPD is confirmed as a bright point by a DFOM (Dark Field Optical Microscope) attached to the Review-SEM and the AFM and laser scattering, and the confirmed bright point is subjected to enlarged-observation by an SEM or AFM, allowing detailed analysis of the LPD.

In contrast, since most of FIB-SEMs (Focused Ion Beam-SEM) for preparing TEM observation samples and manual SEMs are devices without DFOM and laser scattering, it is extremely difficult to observe and to confirm the LPD. In addition, when using a non-wafer-compliant manual SEM, AES device or the like, the sample is cleaved into a chip size to observe and analyze the abnormalities to be analyzed. In this case, the coordinate data on the wafer cannot be used. For confirming an abnormality as the LPD by these devices, it is indispensable to form a marking around the LPD (abnormality).

As described above, the method of forming the marking for identifying the position of the abnormality has an advantage that the method can be used without limitation of the analyzer for detailed analysis of the abnormality. The usefulness of such a method can be further enhanced by the method of preparing the sample surface according to an aspect of the present invention.

The abnormality to be analyzed is a foreign matter, a defect, or the like. For example, when the case that the sample surface having abnormalities to be analyzed is a semiconductor wafer such as a silicon wafer is taken as an example, examples of the abnormalities include defects introduced during crystal growth, various defects occurring during the manufacturing step, adhered foreign matters during the manufacturing step, and the like. These abnormalities often differ from each other in shape, size, position, element type, and the like due to the different origins. Thus, abnormalities can be classified by obtaining detailed information such as shape, size, position and element type through detailed analysis of the abnormalities by an analyzer. Furthermore, the origins of the abnormalities can be estimated by classifying the abnormalities on the basis of the detailed information. If an origin of an abnormality can be estimated, a manufacturing step for reducing or eliminating the origin can be managed, and as a result of managing the manufacturing step, semiconductor wafers in which the occurrence of the abnormality is suppressed can be mass-produced. As a pretreatment for that purpose, the method of preparing the sample surface according to an aspect of the present invention is useful. Furthermore, the analysis method according to an aspect of the present invention using such a method of preparation is useful for managing the manufacturing step.

[Field-Enhanced Oxidation Probe and Scanning Probe Microscope]

An aspect of the present invention relates to a field-enhanced oxidation probe whose tip surface is a metal oxide surface, and a scanning probe microscope including the probe.

The field-enhanced oxidation probe refers to a probe used for forming a local oxide film through field-enhanced oxidation by applying a voltage between the surface and the probe while the probe is in contact with the surface on which the local oxide film is to be formed.

The field-enhanced oxidation probe according to an aspect of the present invention can be prepared by supplying moisture to the probe whose tip surface is a metal surface. Details of the probe to be supplied with moisture, the moisture supply, and the like are as described above. Specific examples of the tip surface of the probe to be supplied with moisture include an alloy surface made of Cr and Au. The oxidation of the alloy is advanced by supplying moisture to the probe having such an alloy surface, and as a result, a probe having an oxide surface of an alloy made of Cr and Au on its tip can be obtained. In addition, specific examples of the tip surface of the probe to be supplied with moisture include an Rd surface. The oxidation of Rd is advanced by supplying moisture to the probe having the Rd surface, and as a result, a probe having an Rd oxide surface on its tip can be obtained. In an embodiment, when the probe tip surface before moisture supply is subjected to AES analysis, an oxygen (O) peak is not detected, or otherwise an oxygen peak having a peak intensity lower than that of an oxygen peak detected by an AES analysis of the probe tip surface after moisture supply is detected. This is considered to indicate that the oxidation is advanced by the moisture supply. Such a field-enhanced oxidation probe is in a state where oxidation of the surface is more advanced than that of the inside, on at least tip.

The scanning probe microscope according to an aspect of the present invention can take the same configuration as that of a known scanning probe microscope except that the field-enhanced oxidation probe according to an aspect of the present invention is installed. The scanning probe microscope according to an aspect of the present invention can be used to form the local oxide film on the sample surface by field-enhanced oxidation. Details on the formation of the local oxide film are as described above.

EXAMPLES

Hereinafter, the present invention will be further explained on the basis of Examples. However, the present invention is not limited to the embodiments shown in Examples. The operations described below were carried out under an environment at a temperature of 22° C. to 24° C. and a relative humidity of 40% to 50%, unless otherwise specified.

Example 1

A silicon epitaxial wafer having an epitaxial layer on a silicon single crystal wafer was once put into a vacuum chamber of an SEM and then taken out from the vacuum chamber. A local oxide film (marking) was formed on the epitaxial layer surface of this silicon epitaxial wafer by the following method. The epitaxial layer surface on which the marking was to be formed was a super-hydrophobic surface (contact angle with respect to water was about 70° to 80°).

(1) Preparation of Hydrophilic Surface

As the hydrophilic surface used for the moisture supply, a surface of a silicon single crystal wafer prepared by SC-1 cleaning and natural drying was used. The surface of the silicon single crystal wafer after SC-1 cleaning had a contact angle with respect to water of about 30°.

(2) Moisture Supply

A probe made of SiN in which a Cr/Au-coated layer was formed on the entire surface was attached to a tip of a conductive cantilever of a scanning probe microscope. A voltage (bias voltage: 10 V) was applied (voltage application period: 5 minutes) in such a way that a negative voltage was applied to the probe side, and the probe side was supposed to be a negatively-charged side and the hydrophilic surface side was supposed to be a positively-charged side while this probe tip was in contact with the hydrophilic surface prepared in the above step (1). While applying the voltage, the probe tip was made to move (scan) in a 20 μm×20 μm area on the hydrophilic surface using a scanning probe microscope in an AFM mode (256 pixels×128 lines).

(3) Formation of Marking

The probe supplied with moisture in the above step (2) was subsequently used for forming a marking while attached to the tip of the conductive cantilever of the scanning probe microscope in the above step (2). A total of four markings (local oxide films) were formed by line-scanning of the probe tip on the epitaxial layer surface at 0°, 450, 90° and 135° with a reference position of 0° using the scanning probe microscope in an AFM mode, while a voltage (bias voltage: 10 V) was applied in such a way that a negative voltage was applied to the probe side, and the probe side was supposed to be a negatively-charged side and the epitaxial layer surface side was supposed to be a positively-charged side in a state where the probe tip supplied with moisture was in contact with the epitaxial layer surface. At the time of line scanning, the probe tip was reciprocated 10 times at an about 4-μm-long interval on each line.

An SEM image of the formed marking is shown in FIG. 1. The formed marking (local oxide film) was charged and clearly confirmed as a bright (white) part as shown in FIG. 1.

When the same operation was subsequently carried out to form a marking having the same shape and size, a total of 10 markings could be formed on the epitaxial layer surface. Each of the ten formed markings had a thickness of about 5 nm to 8 nm. The thickness of the marking (local oxide film) was measured by an AFM. The thicknesses of the markings described below were measured by the same method.

Example 2

When the same operation as in Example 1 was carried out except that no voltage was applied between the probe and the hydrophilic surface in the above step (2), a total of 5 markings (local oxide film) having thicknesses of 5 nm to 8 nm could be formed.

Example 3

When the same operation as in Example 1 was carried out except that moisture was supplied by the following method instead of the above steps (1) and (2), a total of 2 markings (local oxide film) having a thickness of 5 nm to 8 nm could be formed.
<Moisture Supply (Retention Under Wet Atmosphere)>
A probe made of SiN in which a Cr/Au coated layer was formed on the entire surface was put into a sealed container (width: 70 mm×50 mm, height: 10 mm) along with a clean wiper (Clean Wiper SF-30C, manufactured by KURARAY CO., LTD.) which had been cut into 2 cm$^2$ square and soaked in pure water, and allowed to stand for 24 hours. The inside of this sealed container was under a wet atmosphere.

Comparative Example 1

When the same operation as in Example 1 was carried out except that moisture was not supplied, 3 markings (local oxide film) having a thickness of about 1 nm were formed. The marking formed in Comparative Example 1 could not be clearly confirmed in the SEM image.

From comparison among Examples 1 to 3 and Comparative Example 1, it can be confirmed that more markings can be formed by supplying moisture to the probe before formation of the marking, and that a thicker and more clearly observable marking can be formed.

In addition, for example, when the marking is formed in the vicinity of the abnormality on the surface of the epitaxial layer in Examples 1 to 3, the position of the abnormality can be identified by marking. In this manner, the type of the abnormality can be identified and the origin of the abnormality can be estimated by identifying the position of the abnormality using the marking and analyzing the abnormality at the identified position in detail by an analyzer.

[Confirmation of Condition on Probe Tip Surface after Moisture Supply]

To confirm the change of the probe tip after the moisture supply, the probe tip supplied with moisture in the same manner as in Example 1 was analyzed by AES. Also, the probe tip before moisture supply was similarly analyzed by AES. The results of the AES analysis are shown in FIG. 2.

Figure 2:
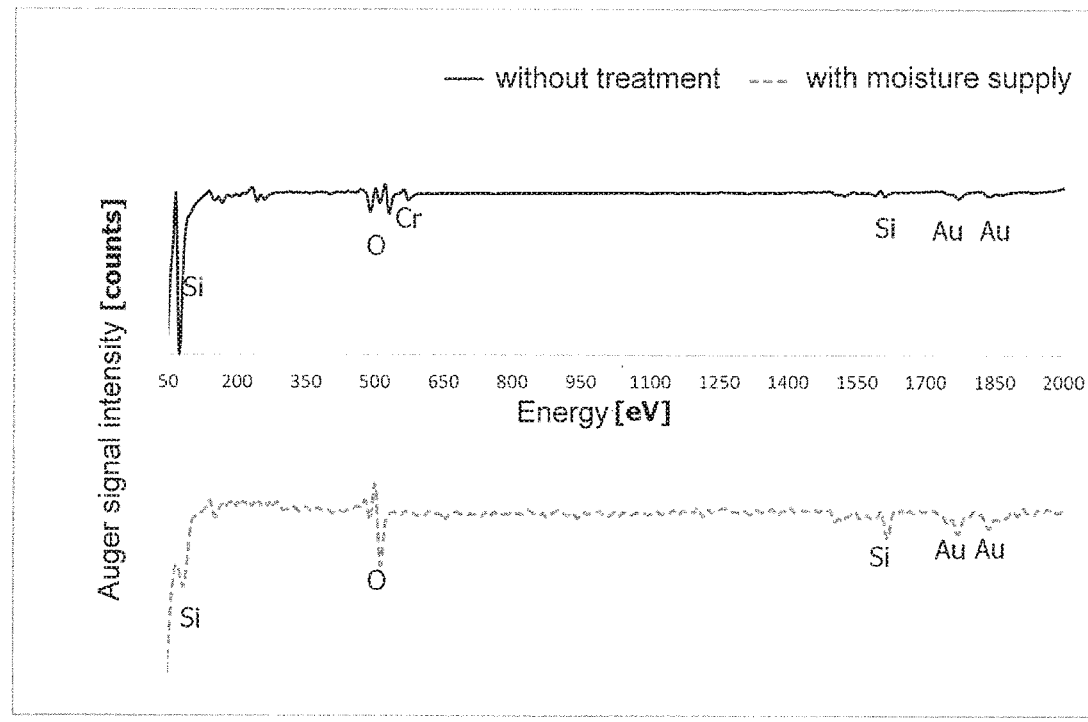
FIG. 2 shows AES analysis results of a probe tip before and after moisture supply.

As shown in FIG. 2, Cr and Au which were materials of the coated layer, Si which was a material of the probe, and O have been detected from the probe tip before moisture supply (i.e. without treatment). On the other hand, O has been intensely detected from the probe tip supplied with moisture (i.e. with moisture supply) compared to the probe tip without moisture supply, and it can be confirmed that the peak intensity of O is so high that the peak of Cr near the peak position of O is hidden. From the above results, it can be understood that oxidation of the probe tip was advanced by moisture supply.

An aspect of the present invention is useful in various technical fields for analyzing foreign matters on a sample surface, including the field of semiconductor wafer manufacture.

The invention claimed is:

1. A method of preparing a marking on a sample surface, the method comprising:
   supplying moisture to a probe;
   bringing the probe in contact with the sample surface, wherein the sample surface is an epitaxial layer surface of a silicon epitaxial wafer; and
   applying a voltage between the probe and the sample surface while a tip of the probe is in contact with the sample surface to form a local oxide film, the local oxide film constituting the marking.

2. The method according to claim 1, wherein the supplying the moisture to the probe comprises bringing the tip of the probe in contact with a hydrophilic surface.

3. The method according to claim 2, wherein the hydrophilic surface is a surface having undergone a cleaning.

4. The method according to claim 3, wherein the surface having undergone the cleaning is a silicon wafer surface.

5. The method according to claim 4, wherein the cleaning is a SC-1 cleaning.

6. The method according to claim 1, wherein the supplying the moisture to the probe comprises holding the probe under a wet atmosphere.

7. The method according to claim 1, wherein the sample surface is a silicon wafer surface.

8. The method according to claim 1, wherein the sample surface is a super-hydrophobic surface or a hydrophobic surface.

9. The method according to claim 1, wherein the probe is attached to a scanning probe microscope.

10. The method according to claim 1, wherein a surface of the tip of the probe is a metal surface.

11. A method of analyzing a sample surface, the method comprising:
   forming, on the sample surface, a marking which indicates a position of an abnormality present on the sample surface, and
   identifying the position of the abnormality by the marking to analyze the identified abnormality by an analyzer, wherein the marking is formed by:
   supplying moisture to a probe;
   bringing the probe in contact with the sample surface; and applying a voltage between the probe and the sample surface while a tip of the probe is in contact with the sample surface to form a local oxide film, the local oxide film constituting the marking.

12. A field-enhanced oxidation probe, wherein at least a tip surface of the probe is a metal oxide surface; and wherein the metal oxide is an oxide of an alloy of Cr and Au.

13. A scanning probe microscope, comprising the field-enhanced oxidation probe according to claim 12.

14. The field-enhanced oxidation probe of claim 12, comprising silicon nitride coated with an alloy including Cr and Au.

15. The field-enhanced oxidation probe of claim 12, comprising silicon coated with Rubidium (Rd).

* * * * *